United States Patent [19]

Ueno

[11] Patent Number: 4,645,955
[45] Date of Patent: Feb. 24, 1987

[54] SIGNAL CONVERSION CIRCUIT FOR PHOTOSENSOR ARRAY

[75] Inventor: Katsunori Ueno, Yokosuka, Japan

[73] Assignee: Fuji Electric Corporate Research & Development, Ltd., Yokosuka, Japan

[21] Appl. No.: 656,091

[22] Filed: Sep. 28, 1984

[30] Foreign Application Priority Data

Dec. 13, 1983 [JP] Japan .................................. 58-234831

[51] Int. Cl.$^4$ .............................................. H03K 5/26
[52] U.S. Cl. .................................... 307/518; 328/111; 328/112; 307/234
[58] Field of Search .................... 340/347 P, 347 AD; 307/234, 518, 525; 328/111, 112

[56] References Cited

U.S. PATENT DOCUMENTS 3,818,358 6/1974 Russell ............................. 328/112 X

*Primary Examiner*—T. J. Sloyan
*Attorney, Agent, or Firm*—Brumbaugh, Graves, Donohue & Raymond

[57] ABSTRACT

A signal conversion circuit is provided for obtaining quantized pattern data indicating a variation of photoelectric signal amplitudes along photosensor arrays by a variable pulse width signal indicating the amplitude of the photoelectric signal from each photosensor. A difference detector detects differences in pulse width of the variable pulse width signals to be compared to determine the extent of the variation with a predetermined unit precision. A comparison device determines whether or not the difference in pulse width exceeds a selected number of difference units and the pattern data indicating the variation are supplied only if the difference exceeds the selected number. Consequently, even if there are errors in the circuit elements constituting the signal conversion circuit, correct pattern data free from influence of such errors can be supplied. If the influence of an error on the circuit elements is to be compensated, a device is provided to determine the precision of the pattern data based on the purpose of the conversion circuit. Therefore, the precision of the pattern data can be kept at the highest possible level. The pulse width difference detector and the comparison device each operate as a quantizing system to convert the variable pulse width signal into a quantized signal at the same time so that it is not necessary to supplement the circuit with a circuit element for initiating operation.

5 Claims, 11 Drawing Figures

SIGNAL CONVERSION CIRCUIT FOR PHOTOSENSOR ARRAY

BACKGROUND OF THE INVENTION

This invention relates to signal conversion circuits for photosensor arrays and, more particularly, to a new and improved circuit for converting analog photoelectric signals emitted by each photosensor element of a photosensor array into variable pulse width signals and then into digital signals, thereby facilitating subsequent data processing.

With recent improvements in semiconductor techniques, miniature photosensor arrays with integrated photosensor elements have been developed, and have found widespread application. However, a shortcoming of such integrated arrays is that the brightness range of an image received on the array may be too large and variable to permit a circuit which receives the photoelectric signals to cope satisfactorily therewith. In other words, the image received on each photosensor element in the array may have a brightness range of about $1:10^6$. Therefore, the minimum output value of the photosensor will be only about 1 $\mu v$ while the maximum output will be about 1v. It is difficult or impossible for an ordinary electronic circuit to handle signals having such a large dynamic range, and, accordingly, the full information content in the photoelectric output of such sensors cannot be utilized.

One way to overcome this difficulty is to convert the photoelectric signal into a form of pulse signal with a variable pulse width and then use the pulse signal for further information processing or further digitize that signal for information processing. According to this technique, the pulse height of the pulse signal can be kept constant regardless of the intensity of lighting, thereby facilitating handling by an electronic circuit, and the information in the variable pulse width signal can easily be converted into a digital value having a corresponding number of bits, for example, by timing the pulse width with a clock pulse, thus facilitating information processing. Such circuits, however, are subject to conversion errors of the type described hereinafter.

Accordingly, it is an object of this invention to provide a signal conversion circuit for an integrated photosensor array having low conversion error whereby pattern data produced from photoelectric signals are obtainable without deterioration of the original pattern data even if there are manufacturing errors in circuit elements.

SUMMARY OF THE INVENTION

In accordance with the invention, a signal conversion circuit includes a device for detecting differences in pulse width of variable pulse width signals, which correspond to the amplitudes of photoelectric signals to be compared, to indicate the degree of variation of the photoelectric signals produced along a photosensor array and determine the limits required for conversion of the photoelectric signals into pattern data having a predetermined precision. For detection of differences in pulse width, a clock pulse generator provides pulses of constant separation and a comparison circuit detects the differences in the numbers of clock pulses occurring during each of the variable width pulses. Alternatively, a strobe pulse generator can be used to determine the interval between pulses and thereby determine the pulse width and the end of each variable width pulse may be used to initiate the determination. In any case, the detecting device has a precision of measurement which is sufficient to convert photoelectric signals into pattern data with high accuracy. In addition a device is provided for determining whether or not the difference in pulse width thus detected is more than a selected value and, if so, providing a quantizing signal. Thus, by separating the arrangement for detecting differences in pulse width and the device for determining the extent of variations of the photoelectric signals, the effect of errors in circuit elements can be prevented from affecting the precision of pattern data. As a result, a highly accurate comparison between two images incident on adjacent photosensor arrays may be obtained. This is especially useful, for example, in distance measuring equipment.

BRIEF DESCRIPTION OF THE DRAWINGS

Further objects and advantages of the invention will be apparent from a reading of the following description in conjunction with the accompanying drawings, in which.

DESCRIPTION OF PREFERRED EMBODIMENTS

Figure 1A:
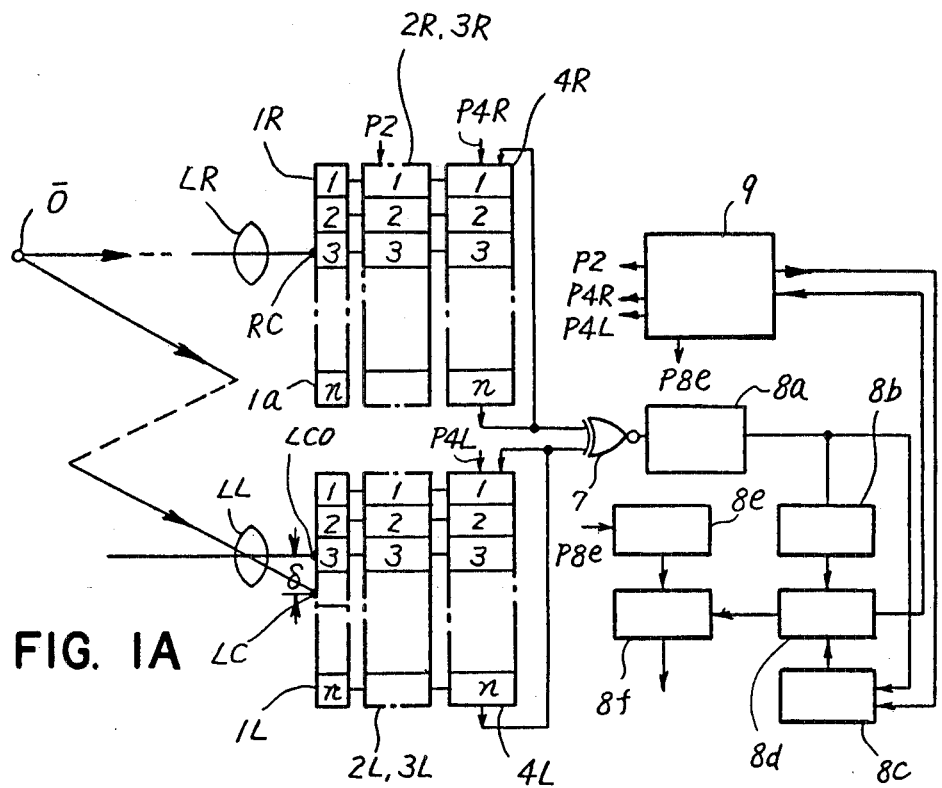
FIGS. 1A and 1B are schematic circuit diagrams illustrating arrangement of components of a typical distance measuring equipment to which a circuit of this invention is applied.
Figure 1B:
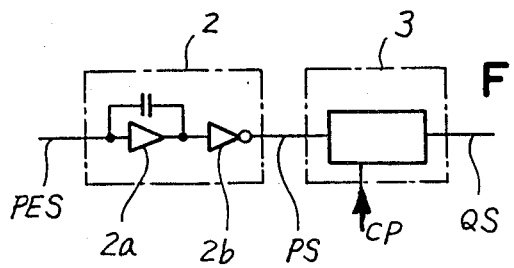

FIGS. 1A and 1B illustrate an example wherein variable width pulse conversion techniques are used in distance measuring equipment. The equipment has a pair of left and and right photosensor arrays 1L and 1R, shown vertically spaced in FIG. 1A. The photosensor arrays each consist of n photosensor elements $1a$, indicated by 1 . . . n in each array, and the light emitted by an object O to which the distance is to be measured is received through a pair of fixed lenses LR and LL. In this arrangement the optical axis of the right lens LR is aligned with the object O. Therefore, the center of an optical image of the object O, formed on the right photosensor array 1R through the lens LR, which is illustrated at a position RC, is constant irrespective of the distance to the object. On the other hand, the center LC of an optical image of the object at a distance closer than infinity which is projected through the left lens LL is displaced by an angle δ from a position LCO at which an object O at infinity is imaged, and the distance to the object is determined by measuring the displacement.

To convert a distribution of photoelectric signals corresponding to a distribution of intensities of light of an optical image received on both the photosensor arrays 1L and 1R along the arrays into signals in the form convenient for information processing, the analog photoelectric signals provided by each photosensor are supplied to left and right pulse signal generating circuit groups 2L and 2R, shown in FIG. 1A. The signals from the circuit groups 2L and 2R are converted into binary or multilevel quantized signals by left and right quantizing circuit groups 3L and 3R.

FIG. 1B illustrates a typical photosensor component in each of these circuit groups, wherein a pulse signal generating circuit 2 has an integrating circuit 2a and a threshold circuit 2b, and a photoelectric signal PES received from the left in the drawing is converted into a variable pulse width signal PS having a pulse width corresponding to the amplitude of the photoelectric signal. A quantizing circuit 3 converts the pulse signal PS into a quantized signal QS indicating the pulse width, for example, by timing the pulse width of the signal with a clock pulse CP. The quantized signals QS from the quantizing circuit groups 3L and 3R are supplied as pattern data into left and right shift registers 4L and 4R shown in FIG. 1A.

To obtain the above-mentioned displacement δ, read pulses P4R and P4L from a control circuit 9 are supplied repeatedly to the initial stages of the shift registers 4R and 4L. Whenever the read pulses are supplied the pattern data are transmitted in succession from the final stages of the shift registers 4L and 4R to a checking circuit 7. The checking circuit may comprise, for example, an exclusive NOR gate which determines whether or not the left and right pattern data coincide with each other. The checking is carried out m times (n>m) with the pattern data in the left and right shift registers 4L and 4R being shifted with respect to each other after each comparison.

Thus, the above-mentioned displacement δ is determined from the number of shifts of the data required to make the left and right pattern data most nearly coincide. The pattern data in the left and right shift registers 4L and 4R can be shifted easily by giving a shift pulse only to one register or the other instead of supplying the read pulse P4L or P4R. Then the data supplied from the final stage of each shift register is fed back to the initial stage as illustrated in FIG. 1A so that the pattern data can be used repeatedly for the successive checking steps.

A check result counter 8a shown on the right side of the checking circuit 7 receives sequential results of the checking circuit 7 and counts the number of times in which the left and right pattern data elements coincide. The counter 8a stores the number of times in which the left and right pattern data coincide during each checking operation. Whenever each checking operation is completed, the count value is transferred to a coincidence register 8b and compared with the previous count value stored in a maximum coincidence register 8c on a comparator 8d. Whenever the count value obtained is greater than the maximum count value previously obtained, the comparator 8d sends a signal to the control circuit 9 to that effect. The control circuit 9 then sends an instruction to transmit that count value to the maximum coincidence register 8c to update the maximum coincidence value.

On the other hand, whenever a shift pulse for shifting the pattern data is supplied to the left and right shift registers, as mentioned above, the control circuit 9 sends a shift number count pulse P8e to a shift number counter 8e. Therefore, the number of shifts to provide the coincidence count is stored in the shift number counter 8e as a count value. Whenever the count value obtained exceeds the maximum count value previously obtained, the comparator 8d transmits a signal to a maximum coincidence shift number register 8f to cause the count value then in the shift number counter 8e to be stored. Thus, when the checking has been completed, the number of the data coincidences for the best match between the left and right pattern data is stored in the maximum coincidence registers 8c, and the shift number for the left and right pattern data at the time of maximum coincidence is stored in the maximum coincidence shift number register 8f. Therefore, the displacement δ will be obtainable from reading the contents of the register 8f and the corresponding distance to the object may be computed.

As will be readily apparent, in the example described above the more closely the pattern data stored in the shift registers 4L and 4R correspond to the distribution of light intensities in the optical image received on the photosensor arrays 1L and 1R, the more accurate will be the result obtained. The above-described technique to convert photoelectric signals into pulse signals with a pulse width indicating dimensions thereof is effective for converting the photoelectric signals having a wide dynamic range into forms suitable for data processing. However, a technique to obtain pattern data by converting the pulse signals into quantized signals indicating amplitude variations in the photoelectric signals from the photosensor arrays is used in the conversion circuit according to this invention, thereby enhancing the accuracy of the pattern data. The principle will be described with reference to FIG. 2.

Figure 2:
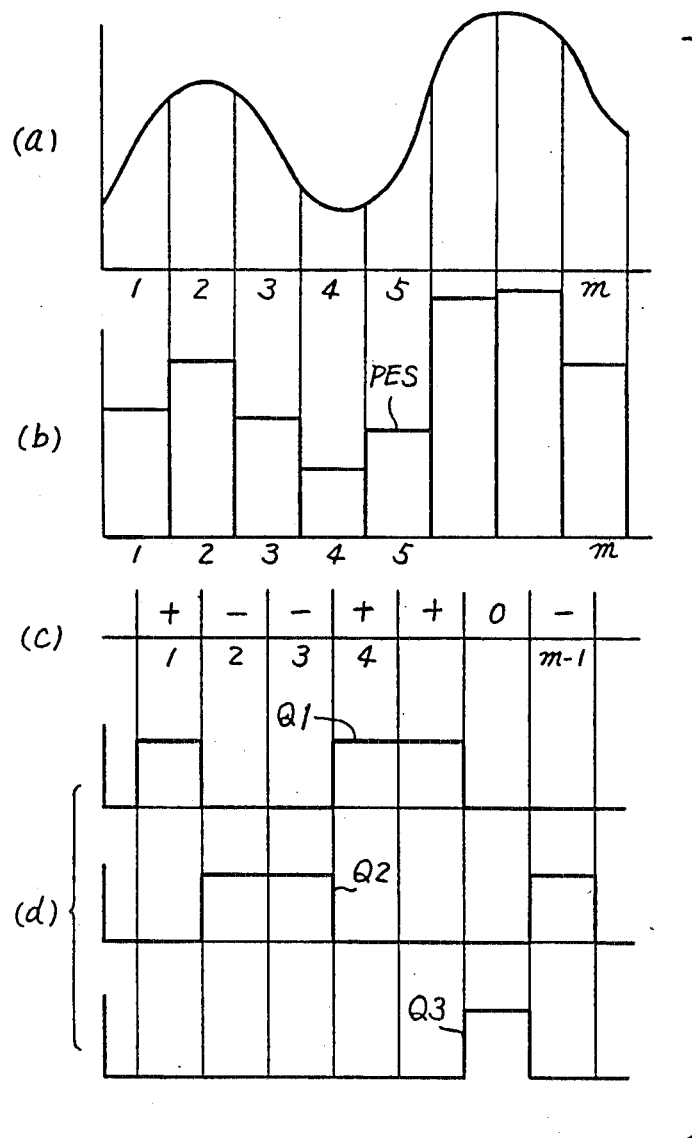
FIG. 2 is a composite graphical representation illustrating a principle for forming pattern data indicating the variation of photoelectric signals along a photosensor array.

In section (a) of FIG. 2 the numbers of photosensors in a photosensor array are indicated by 1 . . . m on the horizontal axis, and a representative distribution of the light intensities of an optical image along the array is given on the vertical axis. Section (b) of FIG. 2 represents the distribution of amplitudes of the photoelectric signal outputs PES from the photosensors when such an optical image is received. Section (c) shows the direction of variation from one photoelectric signal to the next along the array with the symbols +, −, and 0, the numerals shown thereunder indicating image pattern position numbers. For example, the photoelectric output of the second photosensor is higher than that of the first photosensor. Therefore, the first pattern symbol is +. The variation data are expressed as digital values $Q_1$, $Q_2$, $Q_3$ for +, −, and 0 symbols, respectively, in section 2(d) of FIG. 2. Needless to say, the pattern data are not limited to the above three kinds, but can be of other types to indicate the distribution of intensities of lighting in the optical image in greater detail.

Figure 3:
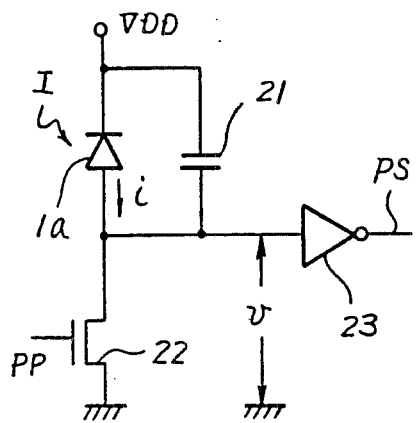
FIG. 3 is a schematic circuit diagram showing a representative circuit for generating a signal having a variable pulse width corresponding to the magnitude of the photoelectric signal.
Figure 4:
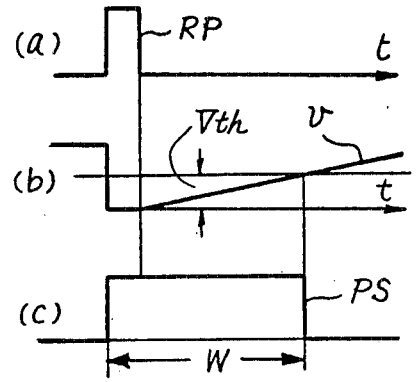
FIG. 4 is a waveform diagram representing a typical signal waveform in the pulse signal generating circuit.

FIG. 3 illustrates a representative circuit arrangement for converting the photoelectric signals into a variable pulse width signal PS, the capacitor 21 being the integrating element of the pulse signal generating circuit 2. To start operation of the integrating circuit, a reset pulse shown in section (a) of FIG. 4 is supplied to a reset transistor 22 for a very short time. The transistor 22 is thereby made conductive to ground an input of an inverter 23 of the threshold circuit, and the input voltage v drops to zero as shown in section (b) of FIG. 4. Thus the output of the inverter 23 is set at "1", and the beginning of a variable pulse width signal PS is formed. The capacitor 21 is charged continuously at a fixed rate from a current-limited supply voltage VDD. The photosensor 1a in this embodiment is a photodiode connected in parallel with the capacitor 21 which generates a current i as a photoelectric signal upon receipt of a light with intensity I, thereby discharging the capacitor 21.

The charging voltage of the capacitor 21 decreases in a gradient proportional to the intensity of light I, and the input voltage v to the inverter 23 increases almost linearly as shown in section (b) of FIG. 4. When the input voltage v reaches a threshold value Vth, for the inverter 23, the output of the inverter becomes "0", and the variable pulse width signal PS is terminated. Accordingly, the pulse width W of the pulse signal PS, which is shown in section (c) of FIG. 4, is almost inversely proportional to the intensity I of the light signal.

Figure 5:
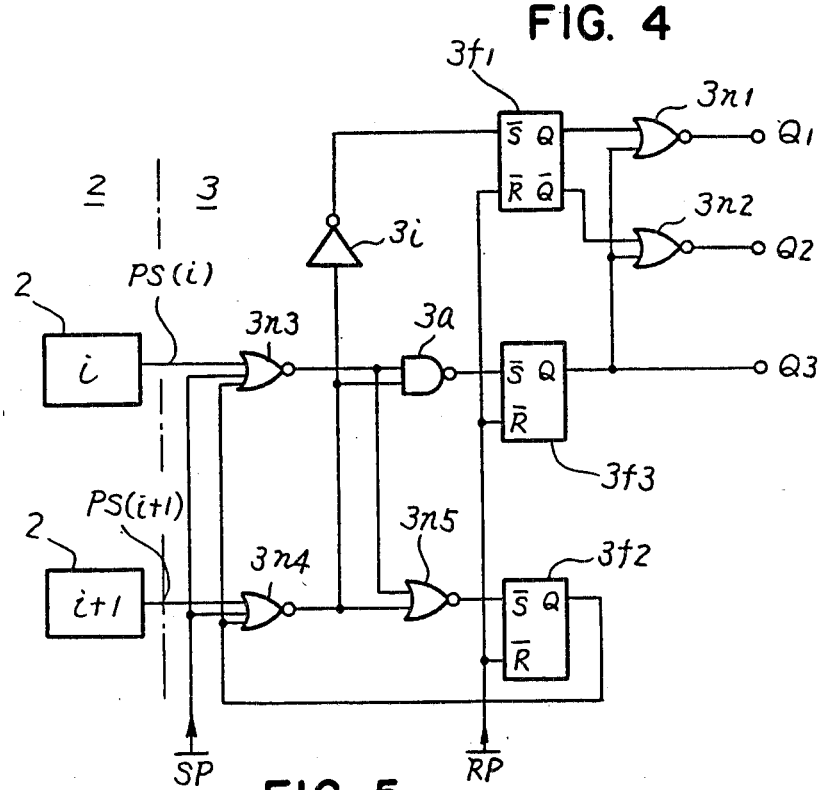
FIG. 5 is a schematic circuit diagram representing a signal conversion circuit of a photosensor array according to the prior art.

FIG. 5 illustrates a representative circuit for converting the pulse signal PS into the quantizing signals Q1, Q2 and Q3, which represent the variation in the amplitude of the photoelectric signals along the photosensor array. Two pulse signal generating circuits 2, for each of two photosensors, namely the i-th and the i+1-th pulse signal generating circuits, are shown at the left of FIG. 5 and the quantizing circuit 3 is shown at the right. Variable pulse width signals PS(i) and PS(i+1) from the i-th and i+1-th pulse signal generating circuits 2 are supplied to NOR gates 3n3 and 3n4, respectively, which are controlled by a strobe pulse signal $\overline{SP}$ and the outputs from these gates control flip-flops 3f1 and 3f3 through a NAND gate 3a, as the logic circuit, and an inverter 3i. Another flip-flop 3f2, for interlocking, is controlled by the NOR gates 3n3 and 3n4 through a NOR gate 3n5. The flip-flop 3f1 detects the variations in photoelectric signals, and the flip-flop 3f3 detects the photoelectric signals which have no variation.

The pattern data Q1, Q2 and Q3, indicating +(increase), —(decrease), or 0 (flat), respectively, as shown in FIG. 2, are supplied from these flip-flops through NAND gates 3n1 and 3n2. The operation of this circuit is already described in detail in the prior application for Japanese patent No. 7275/1983. As explained therein, the above-described strobe pulse signal $\overline{SP}$ is to be understood as one kind of reference clock pulse for quantization. However, the interval between pulses is normally not constant, and the photoelectric signals may be converted into pattern data having a nearly constant precision even with sharp fluctuations of the above-mentioned pulse width W of the variable pulse width signal PS by making tn+1/tn or tn+1—tn to be equal to a constant K or a function of n, where tn denotes a time from a start of signal quantization to the generation of the n-th strobe pulse.

The variable pulse width conversion circuit 3 and the quantizing circuit 5 described above are capable of converting photoelectric signals with a wide dynamic range into pattern data with high precision and further are not influenced by noise which might be present in the photoelectric signals. Nevertheless, the use of such circuits in an embodiment of an integrated circuit shows that there is still a problem. This may result essentially from variations in photoelectric response characteristics between the photosensors included in the array and variations in the capacitance of the capacitor incorporated as an integrating means in the integrating circuit. The latter problem is unavoidable to some extent where integrating circuit elements such as a photosensor, a capacitor and the like are incorporated into one piece of semiconductor chip. The problem will be described with reference to FIG. 6.

Figure 6:
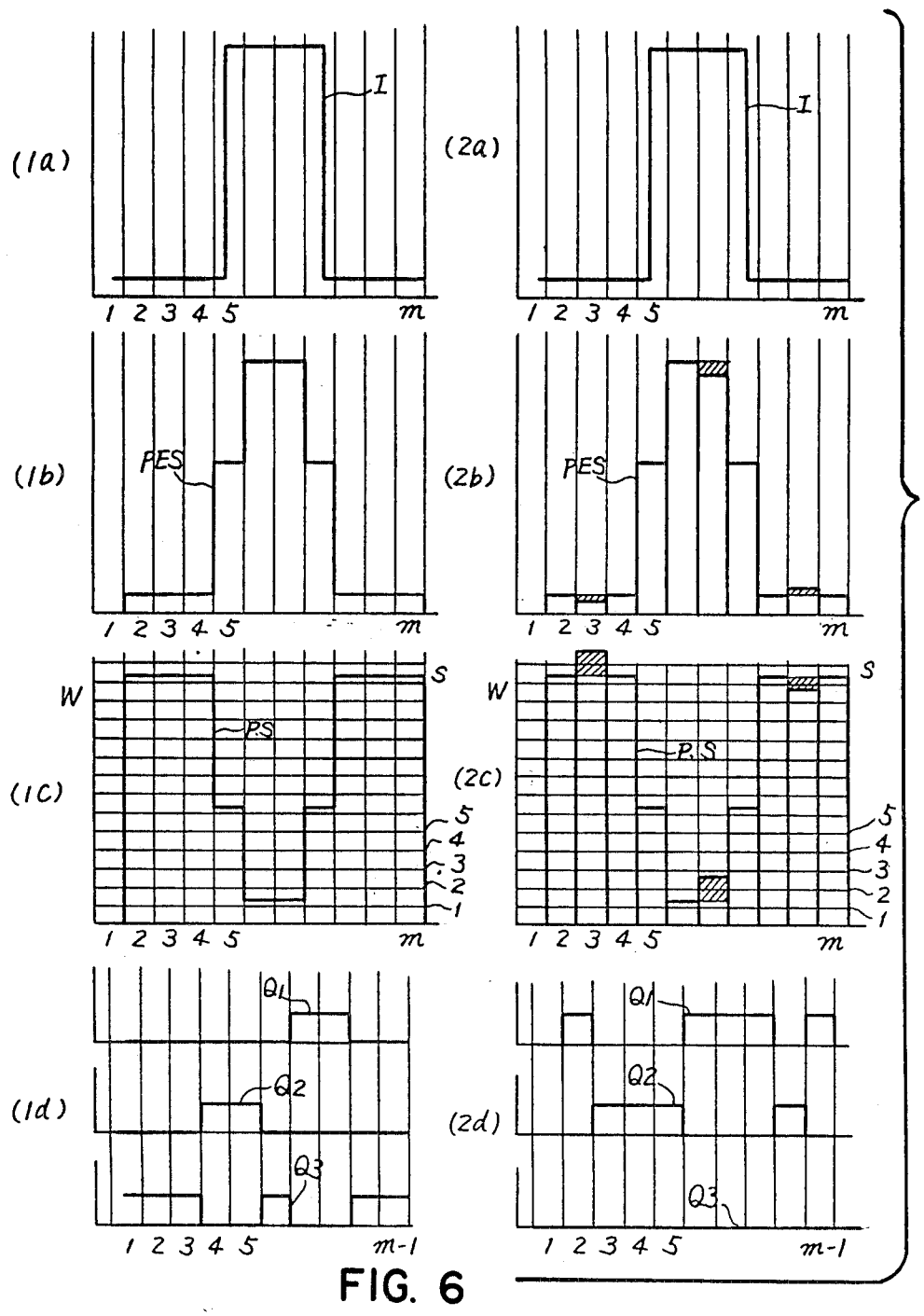
FIG. 6 is a series of graphical representations showing the effect of an error in circuit elements in a conventional circuit on output pattern data.

FIG. 6 illustrates the differences between an ideal case in which there is no variation at all of the circuit elements, represented in sections (1a)–(1d), and a case in which there is a variation in the circuit elements and thus the signal conversion circuit is not capable of producing a normal response, represented in sections (2a)–(2d). Sections (1a)–and (2a) of FIG. 6 represent the simplest distribution of intensities of light of an optical image incident on the photosensor array, with the x axis indicating the numbers of photosensors disposed along the photosensor array and the y axis indicating the intensity of light I, the distribution being exactly the same in both cases. Sections (1b) and (2b) of FIG. 6 represent the distribution of photoelectric signals from photosensor arrays resulting from the optical image, the hatched portions of section 2(b) showing the errors in the photoelectric signals caused by a manufacturing error in the circuit elements.

The photoelectric signal is converted into the pulse signal PS having a pulse width with a nearly inverse relation to the amplitude of the photoelectric signal by the pulse generating circuit. Sections (1c) and (2c) of FIG. 6 represent the pulse width and the positions of strobe pulses for quantizing the pulse signal are indicated by vertical lines in sections (1d) and (2d). For simplicity, the interval between the strobe pulses is shown as being constant so that the strobe pulse corresponds to the simplest clock pulse. Hatched zones in section (2c) indicate error portions due to a manufacturing error of the circuit elements, as in section (2b) and it will be apparent that an error may occur in the quantized signal where a vertical line indicating a strobe pulse intersects a hatched zone of section (2c). Sections (1d) and (2d) of FIG. 6 represent the result obtained by converting such pulse signals into the above-mentioned pattern data Q1, Q2, and Q3 by the quantizing circuit. As will be readily apparent, the pattern data shown in section (2d), which include the effect of manufacturing errors in circuit elements, vary appreciably from original pattern data which are shown in section (1d).

It is possible to compensate for such manufacturing errors by small circuit changes. For example, an error which depends on the pulse width may be compensated by gradually expanding the interval between the strobe pulses, or by coarsening a pattern of strobe pulses as the pulse width W increases. Further, since the pulse width W is inversely proportional to the photoelectric signal, or at least decreases with increases in the photoelectric signal, to broaden the pattern of the strobe pulses within limits does not reduce the precision of the pattern data. In such cases, however, the error in the pulse width W resulting from an error in the photoelectric signal is expanded as the pulse width increases. Therefore, it is difficult to compensate such an error completely within the above-described limits, and thus the precision of pattern data necessarily deteriorates. On the other hand, such an error can be compensated simply by increasing the interval between the pulses uniformly with a strobe pulse operating as a clock pulse but this may result in a deterioration of the pattern data precision.

Figures 7, 8:
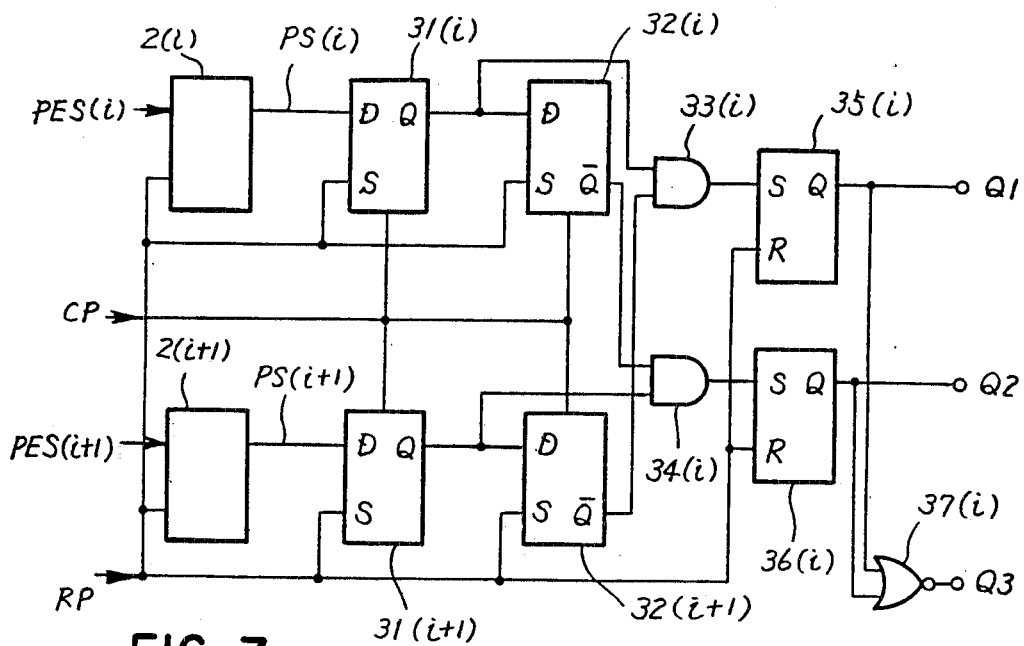
FIG. 7 is a schematic circuit diagram illustrating a representative circuit embodying a difference detecting device and a variation determination device in a conversion circuit for a photosensor array according to this invention.
FIG. 8 is a chart representing an operating state of the circuit of FIG. 7.

FIG. 7 illustrates a representative circuit according to one embodiment of this invention, wherein an i-th variable pulse width signal generating circuit 2(i) and an i+1-th variable pulse width signal generating circuit 2(i+1) are shown on the left side. Variable pulse width signals PS(i) and PS(i+1) are transmitted to a D-type flip-flop group 31(i), 32(i), 31(i+1) and 32(i+1) from the pulse generating circuits 2(i) and 2(i+1) respectively.

In the illustrated embodiment, the flip-flop for each pulse signal has two stages connected in series. That is, the i-th pulse signal PS(i) is received by a first-stage flip-flop 31(i), and an output of that flip-flop is received by a second-stage flip-flop 32(i). Flip-flops 31(i+1) and 32(i+1) are similarly provided with the i+1-th pulse signal PS(i+1). When operation is started, these flip-flops are set by a reset pulse RP as illustrated in FIG. 7. Moreover, since the reset pulse is also supplied to the pulse generating circuits 2(i) and 2(i+1) at the same time, the pulse generating circuits commence operation immediately to generate the pulse signals PS(i) and PS(i+1).

On the other hand, a clock pulse CP is supplied at regular intervals to the flip-flops 31 and 32 immediately after the reset pulse RP is received, and the flip-flops produce an output signal on receipt of each clock pulse according to their input condition. Accordingly, when the first clock pulse is given, the flip-flops 31(i) and 31(i+1) in the first stage change the output Q to "1" as the pulse signals PS(i) and PS(i+1) have already been received by them. When the second clock pulse is given, the flip-flops 32(i) and 32(i+1) in the second stage receive the output Q and change their outputs to "1". Thus the flip-flops are set to "1" within a very short time after commencement of operation and maintain that state despite receiving further clock pulses CP as the pulse signal continues. Needless to say, the clock pulses CP can be strobe pulses having variable intervals between pulses.

As described previously the pulse signals PS(i) and PS(i+1) have a pulse width corresponding to amplitude of the photoelectric signals PES(i) and PES(i+1) from the photosensors, and they change from "1" to "0" after a time which corresponds to the pulse width. Assuming now the i+1-th photoelectric signal PES(i+1) is larger than the i-th photoelectric signal PES(i) and hence the pulse width of the i+1-th pulse signal is shorter than that of the i-th pulse signal, the pulse signal PS(i+1) changes state from "1" to "0" before the pulse signal PS(i) does so.

In the arrangement of this invention, the difference in the pulse width will be detected, and, if the difference results from an error of the circuit elements, it will be neglected, but if the difference results from a variation of the photoelectric signals, then it must be so detected. In this embodiment the difference is detected on the flip-flops 31 and 32. As described above, the pulse signal PS(i+1) changes state from "1" to "0" first, and if the state has already been changed to "0" when a j-th clock pulse is given to the flip-flop group, then only the flip-flop 31(i+1) changes first the output from "1" to "0". Further, when the next, j+1-th, clock pulse is given, the state is transferred to the flip-flop 32(i+1) in the next stage, the auxiliary output $\overline{Q}$ is changed from "0" to "1", and a logic value "1" is supplied to an "increase" deciding AND gate 33(i).

On the other hand, the i-th pulse signal PS(i) is slower in changing the state from "1" to "0", and we will assume that it is slower than the pulse signal PS(i+1) by 1 clock pulse in changing the state. When the j+1-th clock pulse is given in this case, the flip-flop 31(i) changes the output Q from "1" to "0". Since the output Q has been supplied to the AND gate 33(i) as illustrated in FIG. 7 satisfaction of the AND conditions in the AND gate is prevented. Before the j+1-th clock pulse is supplied the AND conditions are not realized in the AND gate since the auxiliary output $\overline{Q}$ from the flip-flop 32(i+1) is "0", and similarly, the AND conditions are not realized when the j+2-th clock pulse and ensuing pulses are supplied. Next, assuming that the pulse signal PS(i) changes the stage from "1" to "0" two clock pulses or more after the pulse signal PS(i+1), an output of the flip-flop 31(i) is maintained at "1" when the j+1-th clock pulse is given. Therefore, the logic value "1" is supplied to the AND gate 32(i) from both the flip-flops 31(i) and 32(i+1) so that the AND conditions are satisified. Accordingly, the output becomes "1" to set an "increase" detecting RS flip-flop 35(i), and thus the pattern data Q1 indicating "increase" is provided.

When the i+1-th photoelectric signal PES(i+1) is smaller than the i-th photoelectric signal PES(i), and hence a pulse width of the i+1-th pulse signal PS(i+1) is longer than that of the i-th pulse signal PS(i), the AND conditions in a "decrease" deciding AND gate 34(i) are realized only if the difference in pulse width encompasses two clock pulses or more, then a "decrease" detecting flip-flop 36(i) is set, and the pattern data Q2 indicating "decrease" is provided.

FIG. 8 illustrates the operating states of the circuit of this embodiment, wherein the logic values indicating states of the flip-flops 31 and 32 are shown for each tendency of "INCREASE", "FLAT", and "DECREASE" of the photoelectric signals, and also for the case where the difference in pulse width is a multiple of the time Δt between clock pulses. Then the condition is shown wherein AND requirements are satisfied in the AND gates 33(i) and 34(i) when the j+1-th clock pulse is supplied.

Figure 9:
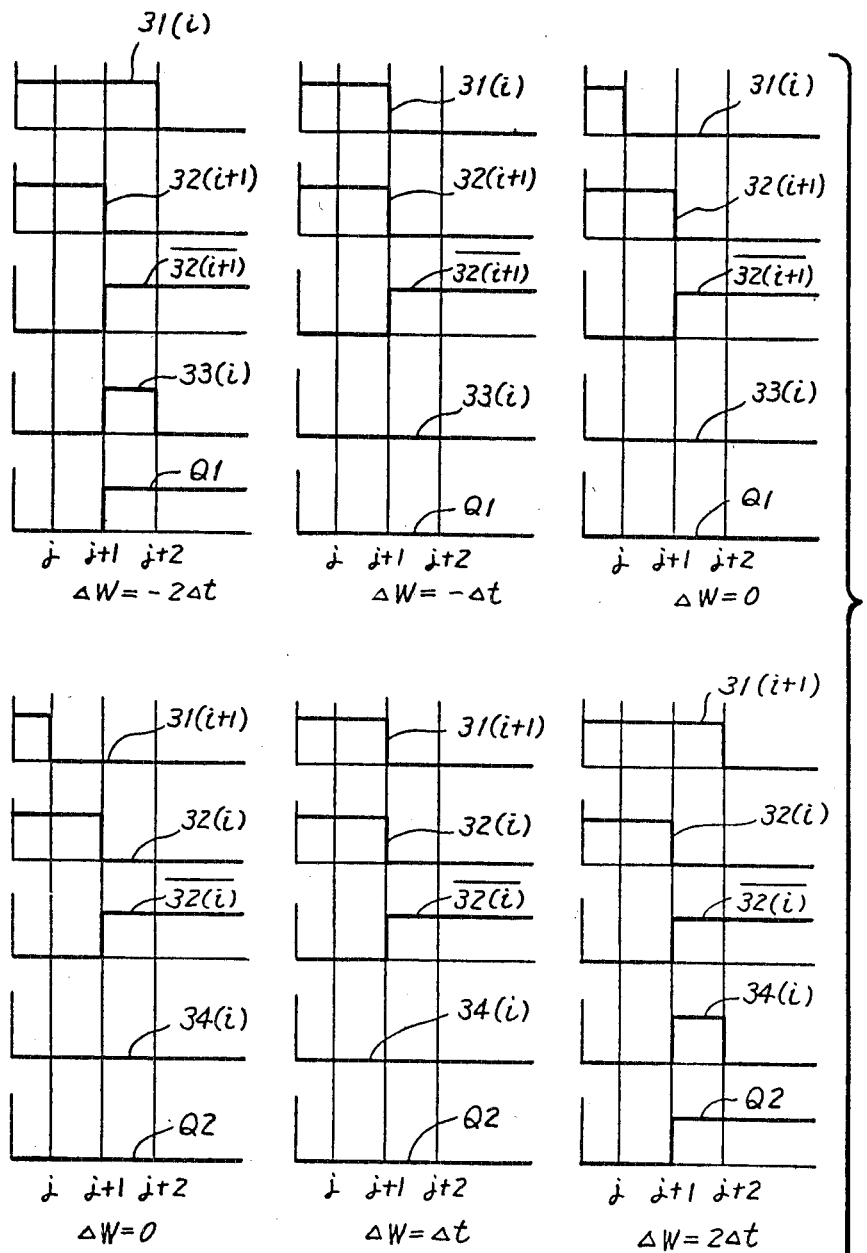
FIG. 9 is a series of waveform drawings representing the waveform of a signal at various points in the circuit of FIG. 7.

Further, FIG. 9 shows the output conditions of the pulse width difference detecting flip-flops 31 and 32, the variation selection AND gates 33 and 34 and the pattern data Q1 and Q2 corresponding to each clock pulse. The various conditions for ΔW in the drawing indicate a comparison of a pulse width of the i+1-th pulse signal PS(i+1) with that of the i-th pulse signal PS(i) as a multiple of the clock pulse interval Δt. A NOR gate 37(i), shown at the right lower portion of FIG. 7, forms the pattern data Q3 indicating "FLAT", which can be provided easily, as will be apparent from the drawing, by taking NOR conditions of the output of the variation detecting RS flip-flop.

In the embodiment described above, when the difference in pulse width between the variable pulse signals to be compared with each other includes only one clock pulse or one strobe pulse, the pattern data indicating flat is generated instead of the pattern data or Q1 or Q2, indicating variation as a difference due to the circuit elements. Only if the difference in pulse width includes two or more clock pulses will the pattern data indicating a variation be generated. Preferably, the number of such clock pulses required to show a variation should be selected in accordance with each particular application.

Figure 10:
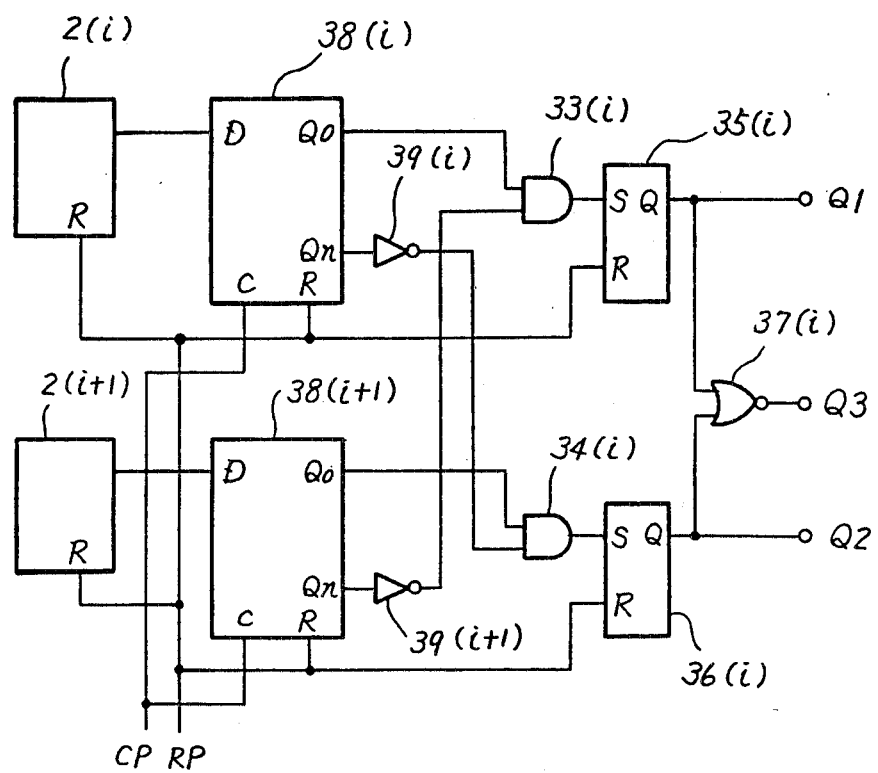
FIG. 10 is a schematic circuit diagram showing another embodiment of this invention.

Another embodiment is shown in FIG. 10. As illustrated, the basic configuration of the circuit of this embodiment is almost the same as in the foregoing embodiment but two shift registers 38(i) and 38(i+1) are used to detect the difference in pulse width instead of flip-flops. These shift registers have, for example, n stages, and an output signal from initial stage Qo, along with a signal from the final stage Qn after being inverted on inverters 39(i) and 39(i+1), are supplied to the variation detecting AND gates 33(i) and 34(i) as in the case of the foregoing embodiment. Like reference characters represent like parts in the foregoing embodiment. Such shift registers with a desired number of stages can easily be incorporated in an integrated circuit.

Since the photoelectric signal PES(i) in the embodiments described above is generated by the photosensors in the photosensor array, the flip-flops 31(i) and 32(i) or the shift register 38(i) as a pulse width difference detection circuit, the AND gates 33(i) and 34(i) as a detecting means and their auxiliary circuits are provided according to the number of photosensors, and all of them can be designed as MOS circuit elements to be incorporated in an integrated circuit. Further, in these embodiments, conversion output signals are all given in pattern data having a designation "INCREASE, "DECREASE" or "FLAT" but the circuit according to this invention can also be arranged to provide other multilevel pattern data or can be arranged on the contrary, to provide only binary pattern data, for example, "INCREASE" or "DECREASE". For increased detecting precision of the differences in pulse width, a strobe pulse can be utilized in place of a clock pulse in the variable pulse width signal generating circuit 2, as described above. Furthermore, a difference detecting strobe pulse can be generated to enhance the difference detecting precision. Other variants within the scope of this invention will be apparent to those skilled in the art for various circuit configurations or particularly for logic circuit configuration.

I claim:

1. A circuit arrangement for comparing two variable width input signals and providing a first output when the first exceeds the second by at least a prescribed amount and a second output when the second exceeds the second by at least a prescribed amount comprising a first input terminal for receiving the first of the two input signals, a second input terminal for receiving the second of the input pulses, a clock terminal for receiving a series of clock pulses, first pulse-width difference detecting circuit means supplied by the first terminal and the clock terminal, second pulse-width difference detecting circuit means supplied by the second terminal and the clock terminal, first and second decision AND circuits, each receiving signals from both the first and second pulse-width difference detecting circuit means for deciding whether the widths of the original input signals differ by more than a prescribed amount and generating an output only when they do, an increase-detecting flip-flop means which is set when the first decision AND circuit supplies an output, a first output terminal supplied by said first increase-detecting flip-flop means, a decrease-detecting flip-flop means which is set when the second decision AND circuit supplies an output, a second output terminal supplied by said decrease-detecting flip-flop means, a NOR circuit which is supplied with the outputs of the increasing-detecting flip-flop means and the decrease-detecting flip-flop means, and a third output terminal supplied by the NOR circuit for generating an output when there is no output at either the first or second output terminals.

2. A circuit arrangement according to claim 1 in which the first and second pulse-width difference detecting circuit means each comprises two D-type flip-flop stages in series, and the first decision AND circuit is supplied both by the output of the first stage flip-flop of the first difference detecting circuit means and by the output of the second stage flip-flop of the second difference detecting circuit means and the second decision AND circuit is supplied by the output of the first stage flip-flop of the second difference detrecting circuit means and by the output of the second stage flip-flop of the first difference detecting circuit means.

3. A circuit arrangement in accordance with claim 1 in which each of the first and second pulse width differences detecting means is a shift register and the AND circuits are supplied with an initial stage from one shift register and a later stage of the other shift register after inversion.

4. A circuit arrangement in accordance with claim 1 in which the clock pulse terminal is supplied with a train of periodic pulses.

5. A circuit arrangement in accordance with claim 1 in which the clock pulse terminal is supplied with a train of strobe pulses whose separation can be varied.

* * * * *